Figure 1:
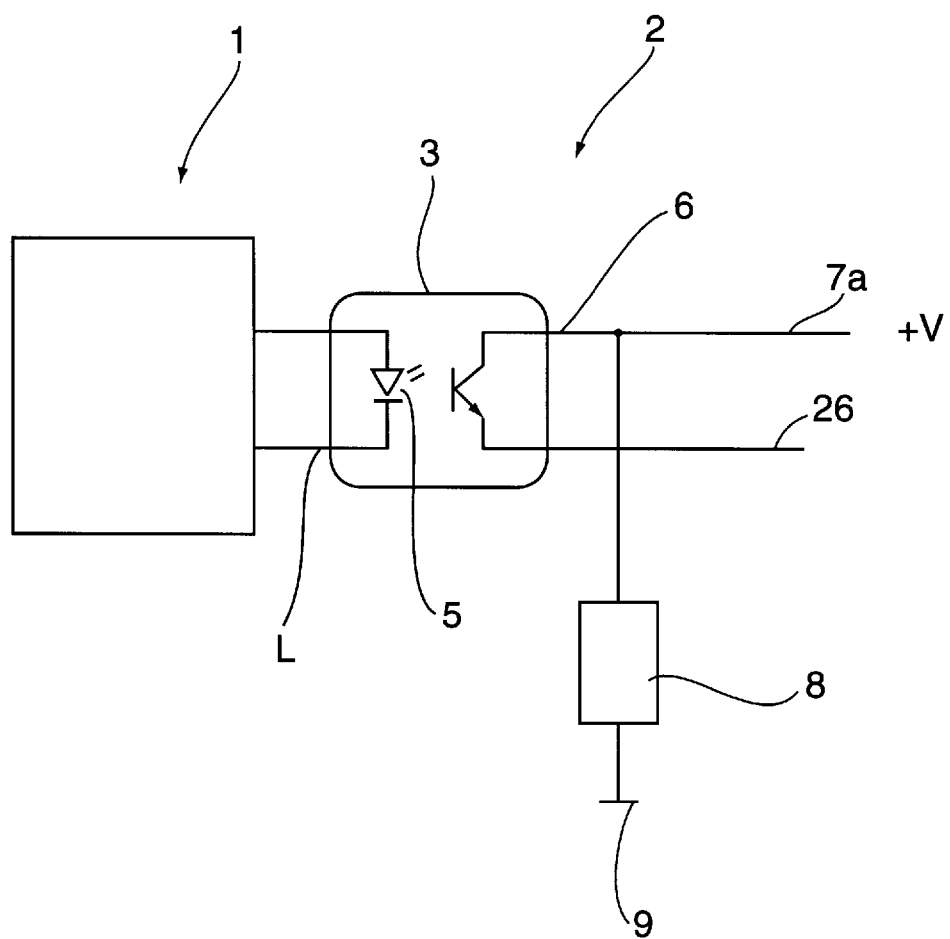

United States Patent
Schwenkel

Patent Number: 5,815,353
Date of Patent: Sep. 29, 1998

[54] OVERVOLTAGE PROTECTOR

[75] Inventor: Hans Dieter Schwenkel, Sturtgart, Germany

[73] Assignee: Pilz GmbH & Co., Germany

[21] Appl. No.: 817,292

[22] PCT Filed: Oct. 3, 1995

[86] PCT No.: PCT/DE95/01357

§ 371 Date: Apr. 15, 1997

§ 102(e) Date: Apr. 15, 1997

[87] PCT Pub. No.: WO96/12332

PCT Pub. Date: Apr. 25, 1996

[30] Foreign Application Priority Data

Oct. 17, 1994 [DE] Germany .......................... 44 36 858.5

[51] Int. Cl.[6] ................................................. H02H 9/00
[52] U.S. Cl. ................................ 361/56; 361/58; 361/91; 361/111
[58] Field of Search ................................. 361/56, 58, 91, 361/117–119, 126–127, 128, 130, 111, 86

[56] References Cited

U.S. PATENT DOCUMENTS

| 3,601,632 | 8/1971 | Frazier | 327/526 |
| 3,731,154 | 5/1973 | Torosian | 361/130 |
| 3,943,427 | 3/1976 | Tolstov et al. | 363/51 |
| 4,437,133 | 3/1984 | Rueckert | 361/33 |
| 5,379,022 | 1/1995 | Bacon et al. | 338/20 |
| 5,644,461 | 7/1997 | Miller et al. | 361/56 |
| 5,650,904 | 7/1997 | Gilley et al. | 361/56 |

FOREIGN PATENT DOCUMENTS

| 1 563 818 | 3/1970 | Germany . |
| 1 563 559 | 4/1976 | Germany . |

OTHER PUBLICATIONS

Siemens, "Technische Mitteilung aus dem Bereich Bauelemente," p. 10, with 3 pages of translation.

Primary Examiner—Jeffrey A. Gaffin
Assistant Examiner—Michael J. Sherry
Attorney, Agent, or Firm—Leydig, Voit & Mayer, Ltd.

[57] ABSTRACT

An overvoltage arrester (8) consists of a plurality of limiter elements (15) connected in series. Parallel to this series of limiter elements (15) is a series of controlled switches (18). The two circuits interconnect ladder-style by means of cross links (23), so that individual limiter elements (15) can be tested by closing the switches (18). The limiter elements (15) are dimensioned so that each limiter element (15) has a breakdown or forward voltage which is less than the lowest operating voltage to be expected at the overvoltage line (8).

21 Claims, 3 Drawing Sheets

OVERVOLTAGE PROTECTOR

BACKGROUND OF THE INVENTION

For every electrical connection between an output and an input, voltages which are higher than the voltage for which the particular component's input or output is rated can be generated at the output or input under consideration due to component faults or parasitic voltages. This risk is present especially for controllers where a controller operating with semiconductors is interconnected with a controlled device via lines which are relatively excessive in length. The hazard for the components cannot be prevented solely, for example, by connecting the output to the input in a potential-free manner via an optocoupler. Here too parasitic voltages due to ground faults or overvoltages caused by electrostatic charges can exceed the permissible voltage between the input and output of the optocoupler and destroy it.

To prevent this, overvoltage protectors are used which are intended to clip overvoltage peaks by diverting an appropriate current to ground.

Nevertheless, it is difficult to assure the functionality of the protector over a long period of time, because a precondition of existing tests is a suitably high overvoltage. If the overvoltage arrester fails to function, the test will have resulted in the destruction of the relevant controller input or output.

SUMMARY OF THE INVENTION

Based on this situation, it is the objective of the invention to create an overvoltage protector which can be tested for functionality without the use of overvoltages.

According to this invention the problem is solved by the overvoltage protector disclosed herein.

Because the new overvoltage protector contains at least two limiter means connected in series between the two power terminals, it is possible to test the limiter means below the clamp voltage of the overall configuration. For this purpose a series of switching devices is connected in parallel to the series of limiter means, with each node of the one series interconnected via a current sensor to a node of the other series. If in the process of testing all switching devices except one switching device are placed in a low-resistance state, then all of the limiter means except one limiter means are essentially short circuited, so that the particular limiter means connected in parallel to the switching device that is not in the low-resistance state, will receive directly the voltage present at the power terminals. Any current flowing is a measure of the functionality of the particular limiter means.

Several different circuit configurations are feasible for implementing this evaluation. For example, the series of limiter means and the series of switching devices can be interconnected in parallel via 0-Ohm electrical connections, i.e. there is one switching device connected directly in parallel to every limiter means. To prevent a current overload of the limiter means during measurement, the series of switching devices contains at least one current limiting element which can if necessary—simultaneously serve as a current sensor. Another possibility is to provide current sensors in the cross links between the two series circuits.

Since the operating voltage and the maximum permissible overvoltage generally differ from one another rather significantly, it is beneficial to have the limiter means consist of several limiter elements connected in series. Furthermore, in the event of triggering this provides a better distribution of the power dissipation.

Candidates for limiter elements are all those components capable of switching from a state of low resistance to a state of high resistance and vice versa, as a function of voltage. Examples of this are zener diodes, diodes, or series circuits made of these, varistors, VDRs [Voltage-Dependent Resistors] and comparable devices, including for example a circuit consisting of a bipolar transistor and a zener diode connected between the base and emitter of the transistor. This assembly then behaves like a zener diode but with a greater level of power dissipation.

Similarly, there are a number of components which are candidates for switching devices, for example electronic semiconductor switches, mechanical switches or relays, depending on the power ranges and operator convenience to be covered.

It is particulary beneficial to have sequencers allocated to the overvoltage protector, so that periodic automatic testing is enabled.

Moreover, further embodiments of the invention are the subject of the sub-claims.

Figure 2:
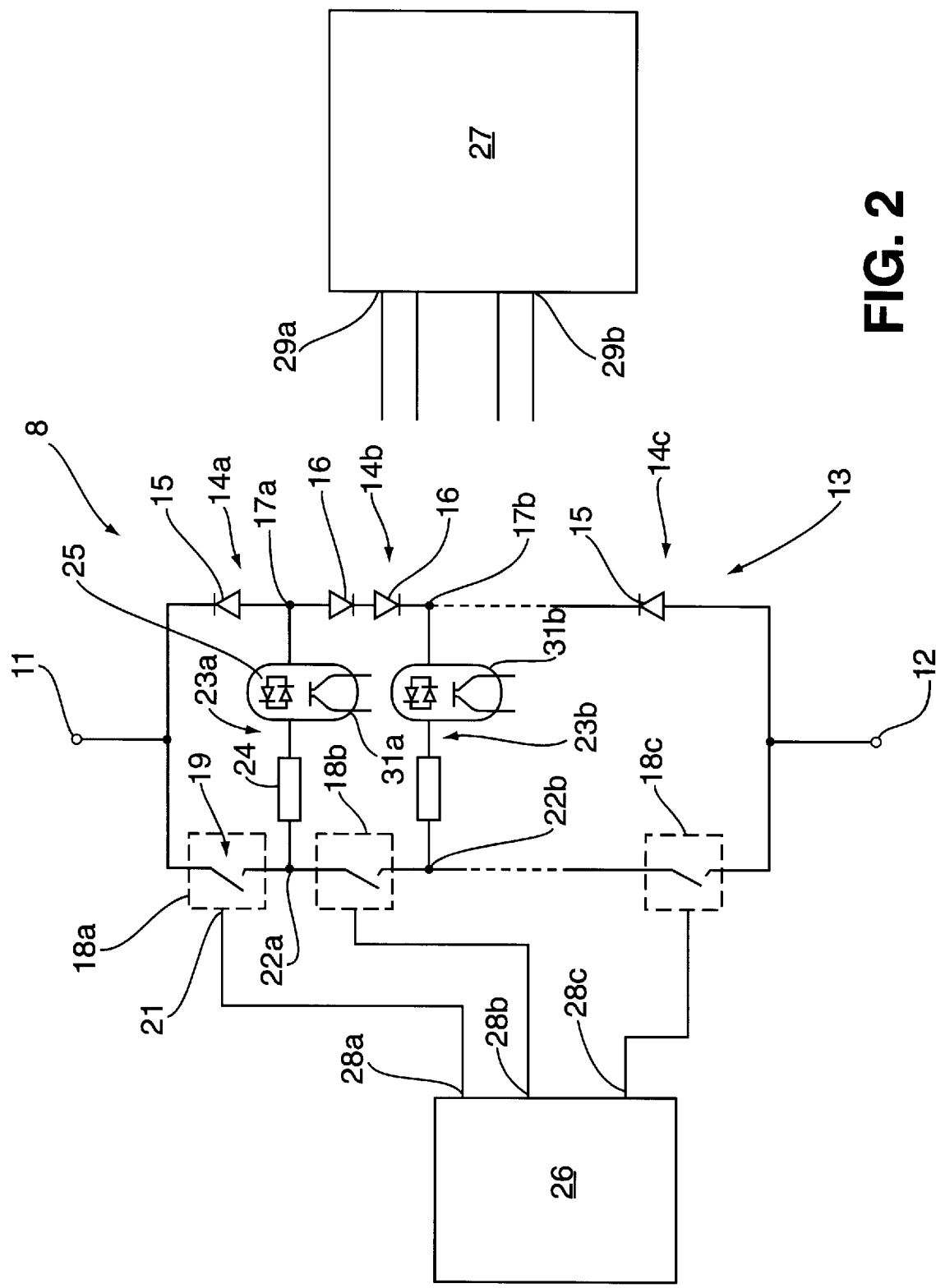
Figure 3:
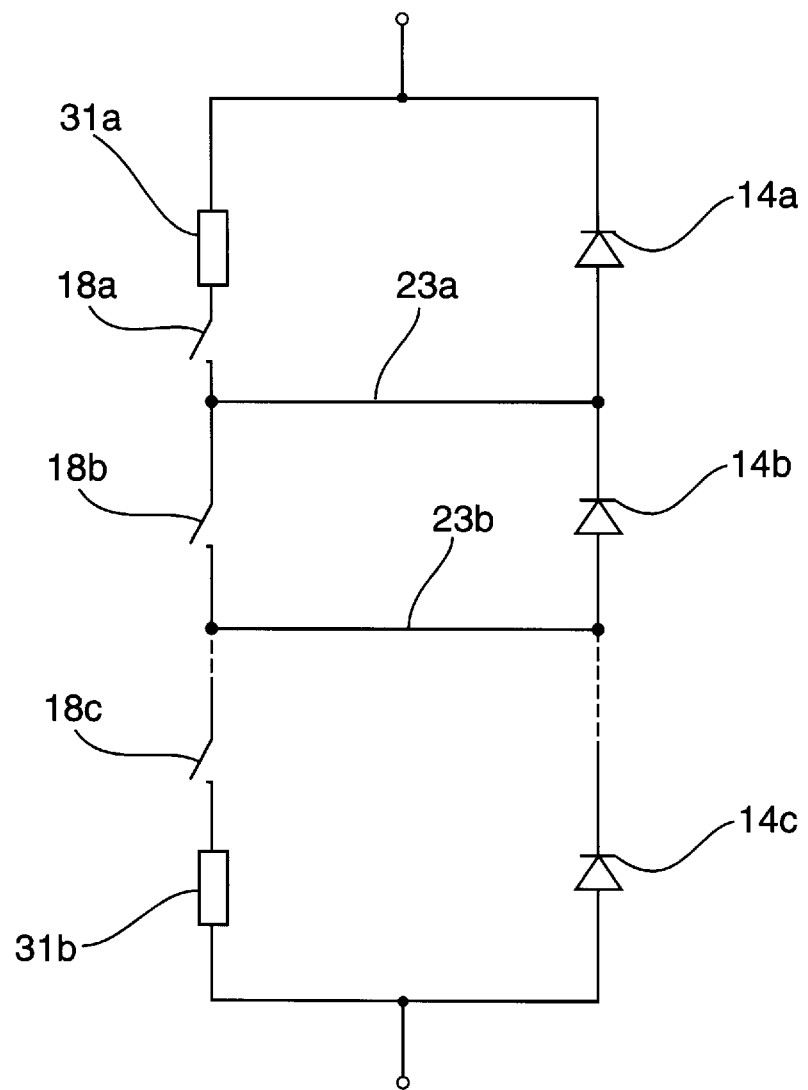

Represented in the drawing are embodiments of the object of the invention. The following are depicted:

FIG. 1 shows a block circuit diagram to demonstrate the application of an overvoltage protector, FIG. 2 shows an initial working model of an over-voltage protector with current sensors included in cross links; and FIG. 3 shows a second working model with current sensors in the series circuit of the switching devices.

FIG. 1 shows an electronic controller 1 with a floating output 2, which is implemented with the help of an optocoupler 3. The input 4 of the optocoupler 3 is connected to a driver circuit which is not specifically illustrated, whereby the light emitting diode 6 contained in the optocoupler 3 can selectively be made to illuminate more or less, in order to make an appropriate electrical signal available at the output 6 of the optocoupler 3. On its output side, the optocoupler 3 is connected to a voltage source +/−V via line 7a, while a line 7b runs to a control input of a controlled load which is not specifically illustrated.

Within the optocoupler there is no electrical connection whatsoever between the input 4 and the output 6, so that no parasitic voltage can be formed toward input 4. However, in the switched-off state, i.e. when the output of the bipolar transistor is blocked, interference pulses originating externally could generate a voltage between lines 7a and 7b, which would overload the switched-off output transistor of the optocoupler 2 with regard to voltage. This can result in a voltage breakdown between the collector and emitter. In order to prevent such critical voltages, which under some circumstances can occur at the output 6, the output 6 of optocoupler 3 is connected via an overvoltage arrester 8 to a ground 9.

The construction of the overvoltage arrester 8 is shown in detail in FIG. 2. It features two connection terminals 11 and 12, which are intended to be connected to the circuit ground 9 or to the output 6 of optocoupler 3. Located between the two power terminals 11 and 12 is a series circuit 13 made up of several limiter means 14a–14c in series. The limiter means 14a is formed by a zener diode 15 as is limiter means 14c. In the same manner, the limiter means 14 located between these two limiter means can each consist of a zener diode, but under no circumstances should a single zener diode be the only element used to create a limiter means 14. Each limiter means 14 may also contain a series circuit of several zener diodes, or e.g. as represented for limiter means 14a it may consist of several simple diodes 16 connected in series. Other components which come under consideration as limiter means 14 are VDRs [Voltage-Dependent Resistors) or dipole circuits with zener diode characteristics, or varistors. In each case it is beneficial to have all limiter means 14a–14c of an overvoltage arrester 8 be identical to one another and exhibit the same characteristics.

In particular, series circuit 13 is constructed such that the cathode of zener diode 15 of limiter means 14a is connected to the power terminal 11. The anode of this zener diode 15 is connected to node 17a, to which—in the case where zener diodes are used exclusively—the anode of the zener diode of limiter means 14b would be connected. The anode of this zener diode would be connected to node 17b, etc. Finally, the anode side of zener diode 15 of limiter means 14c is connected to the power terminal 12.

Connected in parallel to the series circuit 13 made up of limiter means 14 is a series of several electronic switches 18a–18c, each of which features a break 19 as well as a control input 21, where the appended characters are intended to symbolize the associated limiter means 14. All breaks 19 are connected in series. This means that one end of the break 19 of electronic switch 18a is connected to the power terminal 11, while its other end is connected to a node 22a. The break 19 of electronic switch 18a and the break 19 of electronic switch 18b are joined at this node 22a. The latter is connected to a node 22b at its other end.

Finally, the last electronic switch 18c runs to the power terminal 12.

Two corresponding nodes each, 22 and 17, of the series circuit made of the controlled electronic switches 18 and of the series circuit 13 are interconnected via a cross link 23a or 23b. Located in this cross link 23 is a current sensor consisting of an ohmic resistor 24 and a bidirectional optocoupler 25, with the input of the optocoupler 25 connected to the series resistor 24. A bidirectional optocoupler is capable of processing both possible current polarities at its input to generate an output signal. For this purpose it contains two light-emitting diodes connected antiparallel.

As is apparent, the overvoltage arrester 8 contains exactly as many electronic switches 18 as there are limiter means 14, while the number of cross links 23 is 1 (one) fewer.

A control circuit 26 and an evaluation circuit 27 are allocated to the overvoltage arrester 8. Evaluation circuit 26 features several control outputs 28, each of which is connected to a corresponding control input 21 of the electronic switches 18, whereas evaluation circuit 27 is provided with several inputs 29, each of which is connected to an output 31 of one of the optocouplers 25. The lower-case Latin characters again are intended to symbolize the particular allocation.

Dimensioning and operation of the described over-voltage arrester 8 are as follows:

All limiter means 14 have identical voltage-dependent characteristics which—for voltages below a predetermined voltage threshold—cause limiter means to have a relatively high internal differential resistance, while—for voltages exceeding this threshold—the limiter means have, compared to the internal differential resistance for voltages below the threshold a low internal differential resistance. In the following, this voltage limit is referred to as the nominal voltage.

By appropriate selection of the limiter elements used, or selection of the number of limiter elements, the nominal voltage of each limiter means 14 is preset to be less than the lowest voltage expected in normal operation between the output 6 of optocoupler 3 and the ground 9.

However, the number of required limiter means 14 is based on the maximum permissible overvoltage which is acceptable in operation between the output 6 and the ground 9 before the overvoltage arrester 8 should activate. For example, if this overvoltage is four times greater than the lowest voltage observed in operation, four limiter means 14 are required accordingly.

When overvoltage arrester 8 is not being tested for its functionality, all electronic switches 18 are placed in the high-resistance state by the control circuit 26. If an overvoltage occurs at the output 6, the overvoltage is arrested by the limiter means 14 and diverted to ground. Without overvoltage the limiter means 14 are at high resistance and not operating.

To enable testing of the functionality of the individual limiter means 14, the control circuit 26 successively switches all of the electronic switches 18 except one to the low-resistance state. For purposes of explaining the mode of operation, it is assumed that initially only the electronic switch 18a remains open, while all others are being closed. This reduces the clamp voltage of the overvoltage arrester 8 to the nominal voltage of the limiter means 14a. Since its nominal voltage is less than the lowest value to be expected between the output 6 and the ground 9, limiter means 14a becomes conductive, and a current begins to flow from power terminal 11 through the cross link 23a, and from there via the closed electronic switches 18b–18c to the power terminal 12. The amperage of the current is measured with the help of the current sensor, consisting of the series resistor 24 and the optocoupler 25, with the sensor feeding its reading to the associated input 29a of evaluation circuit 27.

When the limiter means 14 is operating properly, a current of known intensity flows through cross link 23a, However, if the limiter means 14a is short-circuited or the nominal voltage has dropped for other reasons, a higher current flows through cross link 23a, and this condition can be used to determine the presence of a fault. If no current at all is flowing through cross link 23a, the limiter means 14a has failed.

In the next step for testing the overvoltage arrester 8, the switch 18b is opened and the switch 18a is closed. Now current can flow from the power terminal 11 via the closed electronic switch 18a and the cross link 23a to the limiter means 14b, and from there via cross link 23b to the remaining cascade set of electronic switches 18 to power terminal 12. The current measured by the current sensor of the cross link 23a or 23b is, again, characteristic of either the proper operation of limiter means 14b or of its failure.

Analogously, all limiter means 14 are tested successively in the same manner, and the amperage readings obtained are analyzed accordingly by the evaluation circuit 27.

For the new overvoltage arrester 8, it is clearly necessary that it be constructed of individual limiter means, so that it can be tested in normal operation without the use of critical overvoltages. During testing, except for the limiter means under test, all remaining limiter means are essentially shunted or short-circuited by the electronic switches connected in parallel.

FIG. 3 represents a variant of the embodiment of the overvoltage arrester 8, where components already described have been assigned the same reference characters.

In comparison to the embodiment of FIG. 2, the significant difference lies in that the cross links 23 are configured as electrical short circuit connections, and that current limiting elements or current sensors 31a and 31 are included only at the upper and lower ends of the series of electronic switches 18.

The overvoltage arrester per FIG. 3 is dimensioned in the same manner as it is for the embodiment of FIG. 2. The limiting effect in normal operation is also identical.

To check the individual limiter means 14, as before, all electronic switches 18 except one electronic switch 18 are set to low resistance, so that during this time the voltage at the output 6 is only applied to the limiter means 14 whose associated electronic switch 18 is open. Accordingly, more or less high currents flow through the two series resistors 31a and 31b, and the voltage drop generated there enables an evaluation regarding the functionality of the limiter means 14 under consideration.

The reading can, exception for the limitation below, be taken either at resistor 31a or resistor 31b. However, the choice of measuring resistor 31a or 31b is not optional if the electronic switch 18 connected direct to the corresponding resistor 31a or 31b is open. The test reading must then be taken at that resistor, 31a or 31b, whose corresponding electronic switch 18 is closed.

I claim:

1. An overvoltage protector, comprising:

a first and second power terminals, at least two limiter means connected in series, whose forward d.c. resistance goes to a high value below a predetermined forward voltage and to a low value above said forward voltage, where the series circuit made up of said limiter means is connected between the first and second power terminals, and where the sum of said forward voltages of at least two limiter means serves to define a maximum permissible voltage between the first and second power terminals, while said forward voltage of each individual limiter means is less than a minimum preselected input voltage at the first and second power terminals that is not zero, and a series circuit of switching devices connected across the first and second power terminals, each of the switching devices having a control input, where the number of switching devices equals the number of limiter means, and each of the switching devices can assume either a high-resistance or low-resistance state, and where each node between adjacent switching devices is interconnected with a corresponding node between adjacent limiter means via an electrical cross link.

2. The overvoltage protector of claim 1, wherein each cross link includes a current sensor.

3. The overvoltage protector of claim 1, wherein the number of cross links is one fewer than the number of limiter means.

4. The overvoltage protector of claim 1, wherein each cross link is a zero-Ohm (0-Ohm) electrical connection, and the series circuit of the switching devices has at least one current limiter.

5. The overvoltage protector of claim 4, wherein the current limiter includes a current sensor.

6. The overvoltage protector of claim 5, wherein the current sensor includes a resistor, preferably an ohmic resistor.

7. The overvoltage protector of claim 5, wherein the current sensor includes an optocoupler.

8. The overvoltage protector of claim 7, wherein the limiter element is a zener diode, a diode, a varistor, a VDR (Voltage-Dependent Resistor) or another component or an assembly with a dipole connection to the circuit which features the appropriate characteristics.

9. The overvoltage protector of claim 8, wherein the switching device is an electromechanical switch with a control input.

10. The overvoltage protector of claim 5, further comprising a first current limiter electrically connected between the first power terminal and a first end of the series circuit of switching devices and a second current limiter electrically connected between the second power terminal and a second end of the series circuit of switching devices.

11. The overvoltage protector of claim 1, wherein each limiter means is formed by either an individual limiter element or a series circuit of at least two limiter elements.

12. The overvoltage protector of claim 1, wherein the switching device is an electronic switch.

13. The overvoltage protector of claim 1, further comprising a control circuit for activating the switching devices in succession.

14. The overvoltage protector of claim 1, further comprising an evaluation circuit for evaluating in succession values of the current sensors read at the limiter means.

15. The overvoltage protector of claim 1, further comprising an evaluation circuit for evaluating in succession voltages read at the limiter means.

16. The overvoltage protector of claim 2, wherein the current sensor includes a resistor, preferably an ohmic resistor.

17. The overvoltage protector of claim 2, wherein the current sensor includes an optocoupler.

18. The overvoltage protector of claim 17, wherein the limiter element is a zener diode, a diode, a varistor, a VDR (Voltage-Dependent Resistor) or another component or an assembly with a dipole connection to the circuit which features the appropriate characteristics.

19. The overvoltage protector of claim 18, wherein the switching device is an electromechanical switch with a control input.

20. The overvoltage protector of claim 19, wherein the electromechanical switch is a relay.

21. An overvoltage protector, comprising: a first and second power terminals, at least two limiter means connected in series, whose forward d.c. resistance goes to a high value below a predetermined forward voltage and to a low value above said forward voltage, where the series circuit made up of said limiter means is connected between the first and second power terminals, and where the sum of said forward voltages of at least two limiter means serves to define a maximum permissible voltage between the first and second power terminals, while said forward voltage of each individual limiter means is less than a minimum preselected input voltage at the first and second power terminals that is not zero, and a series circuit of switching devices connected across the first and second power terminals, each of the switching devices having a control input, where the number of switching devices equals the number of limiter means, and each of the switching devices can assume either a high-resistance or low-resistance state, and where each node between adjacent switching devices is interconnected with a corresponding node between adjacent limiter means via an electrical cross link, wherein each cross link includes a current sensor.

* * * * *